United States Patent [19]
Alsberg et al.
[11] 3,770,571
[45] Nov. 6, 1973

[54] FABRICATION OF PRINTED CIRCUIT BOARDS

[75] Inventors: Henry Alsberg, Northbrook; Ronald A. Frederiksen, Schaumburgh, both of Ill.

[73] Assignee: The Richardson Company, Melrose Park, Ill.

[22] Filed: Apr. 2, 1969

[21] Appl. No.: 812,900

[52] U.S. Cl............ 161/217, 161/DIG. 7, 174/68.5, 117/47 A, 117/47 H, 117/47 R, 156/150, 204/20, 204/30

[51] Int. Cl............................................. B32b 15/08

[58] Field of Search.................... 174/68.5; 161/217, 161/255, DIG. 7; 204/20, 22, 15, 30, 49; 117/47 A, 47 H, 47 R; 156/2, 150

[56] References Cited

UNITED STATES PATENTS

| | | | |
|---|---|---|---|
| 3,436,233 | 4/1969 | Jackson | 117/47 A |
| 3,547,785 | 12/1970 | Sakuma | 204/30 |
| 3,567,594 | 2/1971 | Wells | 204/20 |
| 2,965,624 | 12/1960 | Anderson | 260/94.2 M |
| 3,472,678 | 10/1969 | Bruins et al. | 117/47 A |
| 2,876,530 | 3/1959 | Howatt | 29/155.5 |
| 2,912,747 | 11/1959 | Oshry et al. | 29/155.5 |
| 3,198,774 | 8/1965 | Huxtable et al. | 260/879 |
| 3,240,662 | 3/1966 | Smyers et al. | 260/879 X |
| 3,267,007 | 8/1966 | Sloan | 204/22 X |
| 3,305,460 | 2/1967 | Lacy | 204/20 |
| 3,333,024 | 7/1967 | Haefele et al. | 260/879 X |
| 3,445,350 | 5/1969 | Klinger et al. | 204/20 X |
| 3,466,232 | 9/1969 | Francis et al. | 204/20 X |
| 3,515,649 | 6/1970 | Hepfer | 204/20 X |
| 3,518,067 | 6/1970 | Barth | 204/20 X |

OTHER PUBLICATIONS

Margerison, D., et al., An Introduction to Polymer Chemistry, Pergamon Press, New York, pp. 4–6.
Thompson, M. S., Gum Plastics, Reinhold, N.Y. (1958), pp. 61–68.
Huopana, R. O., "Printed Wiring Board Manufacturing," IBM Bull. p. 36, (1959).

*Primary Examiner*—George F. Lesmes
*Assistant Examiner*—Ellis P. Robinson
*Attorney*—John L. Hutchinson, William Lohff and Alan M. Abrams

[57] ABSTRACT

The invention is directed to a printed circuit board with a substrate characterized by a polymeric hydrocarbon surface based on a conjugated diene polymer such as butadiene polymer, and a metal coating directly bonded as by electroless deposition to at least a portion of the hydrocarbon surface. In particular, the printed circuit board is characterized by a reinforced hydrocarbon substrate based on the conjugated diene polymer and an unusually superior bond between the metal and hydrocarbon surface. One method of producing the board is carried out with an uncured polymer as the hydrocarbon surface wherein after the metallizing step, the board is subjected to curing conditions to form a thermoset substrate.

9 Claims, No Drawings

FABRICATION OF PRINTED CIRCUIT BOARDS

BACKGROUND

This invention relates to printed circuit boards having a substrate with a hydrocarbon surface and a metal coating directly bonded to at least a portion of the hydrocarbon surface. More particularly, it relates to a printed circuit board with a hydrocarbon surface based on a conjugated diene polymer, to a coating of electrolessly deposited metal, and to unusual bond strengths between the metal and hydrocarbon surface.

As known, printed circuit boards have become an important commercial form of circuits for the electronic industry. In general, they comprise a metal coating in a particular design representing a circuit or circuits attached either directly or indirectly (i.e., by adhesives) to the surface or surfaces of an electrically nonconductive substrate. Often the substrate is rigid as in reinforced epoxies, although it can also be flexible as in polyester films.

Several important advantages have resulted from the use of printed circuit boards. These include dimensional reproducibility of both the circuit elements and their physical separation which are particularly important with higher frequencies and with miniature circuits. Also several boards can be combined to form multilayer printed circuit boards in compact form.

While prior printed circuit boards have been very useful, they have not been entirely satisfactory. With the use of higher frequencies and miniature circuits, the electrical properties of the substrate are of increased importance to the performance of the circuit. In many instances, such properties as dielectric constant, surface conductivity and dissipation power factor are desired to be fairly low as well as constant as possible over any temperature changes. Particularly with multilayer printed circuit boards, an excessive dissipation power factor can cause temperature changes in the confined or buried substrates and result in changes in the circuit characteristics. Therefore, the development of improved printed circuit boards is desirable.

SUMMARY

Briefly, the invention is directed to an article of manufacture and more particularly to a printed circuit board having a substrate characterized by a hydrocarbon surface based on a conjugated diene, and a metal coating directly bonded to at least a portion of the hydrocarbon surface. The resultant printed circuit board commonly exhibits resistance to delamination at the metal bond of at least 1 lb./in. in a test of 90° peel strength and provides several other advantages over the prior art.

Advantageously, the printed circuit boards of the invention are produced by forming a surface layer on the substrate of an unsaturated hydrocarbon layer based on the conjugated diene polymer, etching and sensitizing part or all of the surface, and depositing a coating of electroless metal on the sensitized surface. In this way, the metal coating is directly bonded to the hydrocarbon surface and is characterized by very useful bond strengths. In addition, the boards in final form, are often based on thermoset polymers and the resulting products exhibit very satisfactory performance in standard dip solder tests required to measure solderability of the circuit elements.

DETAILED DESCRIPTION

The printed circuit board of the invention comprises a substrate characterized by a hydrocarbon surface wherein the hydrocarbon is based on a conjugated diene polymer, and a metal coating directly bonded to at least a portion of the hydrocarbon surface. The printed circuit board is in the form commonly utilized in the industry and can have one or more apertures extending part or all of the distance between generally opposite, external surfaces. The desired polymeric hydrocarbon is present on at least one of the surfaces of the board and advantageously on all surfaces associated with the formation of circuit elements.

Commonly, the entire substrate is composed of the hydrocarbon and advantageously reinforcing members such as layers of paper, glass, etc., or fillers of glass or other relatively inert materials. In some instances, the reinforcing members are pretreated to improve bonding with the polymeric hydrocarbon as illustrated by the pre-treatment of paper with a phenol-formaldehyde resin. Hydrocarbon laminates composed of a reinforcing member such as phenol-formaldehyde treated paper and the hydrocarbon polymer are a particularly useful form of the substrate.

The substrate can also be formed from other core materials such as phenolics, epoxies, polyesters, ceramics, and the like wherein one or more surfaces are coated at least partially with the defined polymeric hydrocarbon. In some instances, a thermoset hydrocarbon serves as a core for subsequent application of a coating of the unsaturated hydrocarbon. Advantageously, this hydrocarbon core is subjected to etching conditions to improve bonding between the core and coating.

The hydrocarbon surface of the substrate is composed of a hydrocarbon polymer based on a conjugated diene such as butadiene, isoprene, and the like including mixtures thereof. Advantageously, for purposes of satisfactory bonding, the hydrocarbon is based on a conjugated diene content of at least 25 mole percent and preferably 35–100 mole percent. The remaining hydrocarbon units are derived advantageously from vinyls such as styrene, vinyl toluene, ethylene, propylene, and the like including mixtures thereof. Preferably, the hydrocarbon is a butadiene homopolymer or copolymer with styrene.

Polymers and copolymers of the conjugated diene include both liquid and solid forms as in random, graft, and block copolymers of butadiene and styrene. It is understood that these polymeric products also include those with polar end groups such as hydroxy terminated and carboxy terminated polymers. In many instances, the liquid forms are particularly advantageous because of the ease of application to core materials and their performance in the final product. In general, these liquid polymers have a number average molecular weight of about 500–5,000 and a styrene content of about 0–50 mole percent. Often they are also characterized by a vinyl unsaturation of about 50–90 percent of the total unsaturation. In solid form, they comprise higher molecular weight products, or partially cross-linked products, or block copolymers as generally described in U.S. Pat. No. 3,265,765.

The phenomena involved in the unusual performance of the hydrocarbon in respect to the bonded metal circuit elements is not completely understood. As described herein, the hydrocarbon in both its incompletely cured and thermoset forms provides a surface for metallizing with highly satisfactory bond strengths. While it has not been completely determined, it is believed that the presence of olefinic unsaturation in the hydrocarbon is related to the development of satisfactory bond strengths in the resulting printed circuit boards. Accordingly, some minimum unsaturation sufficient to provide a base for electroless deposition of metal is present in the initial hydrocarbon surface and is provided by the polymeric units derived from the conjugated diene. Usually, when the hydrocarbon polymer contains the lower values of butadiene units, the metallizing procedure can be advantageously carried out on an incompletely cured polymer and the final cure can be carried out after the board has been formed.

The hydrocarbon surface is formed on the substrate by various methods. In some instances, an uncured hydrocarbon is applied to the core material as a coating, metallized advantageously by electroless deposition, and then cured to the desired extent. This method provides a surface which is easily metallized with good bond strengths and a final thermoset or partially thermoset board. In other instances, a reinforced board is fabricated from an unsaturated hydrocarbon polymer and a reinforcing element. In a partially cured form, the board is then metallized and cured to the final desired extent. In still other instances, the unsaturated hydrocarbon is in a cured thermoset form which is capable of being metallized by electroless deposition. In addition, the board can be fabricated from the hydrocarbon on a backing of synthetic fibers and metallized without being cured to a thermoset.

In the above curing or partially curing, the extent of cure is controlled by the selection of the curing agent and temperature. In many instances, it is advantageous to utilize two or more curing agents or temperatures to provide both an initial partial cure and a later final cure under different conditions. Suitable curing agents include organic peroxides as listed in Kirk-Othmer, *Encyclopedia of Chemical Technology*, Vol. 14 and particularly those with activation temperatures of 30°–50° C. and above, by sulfur-containing vulcanizers such as those commonly used with synthetic or natural elastomers, and by the use of irradiation to generate free radicals. Temperatures are usually in the order of 80°–100° C. and above to provide the desired cure.

After formation of the desired hydrocarbon surface, the substrate surface is etched and sensitized. Advantageously, the etching is carried out with strong acids such as sulfuric or phosphoric with substances such as sodium dichromate. The severity of the etch is somewhat dependent on the extent of cure of the hydrocarbon surface as illustrated by Examples I and III. The sensitizing step is carried out with reducing agents such as stannous chloride followed by palladium chloride or other catalyst. It is understood that partial masking of the surface can be carried out before the etching or sensitizing step to limit the modification of the surface where only insulating and not circuit properties are required.

A metal coating is then applied to the sensitized surface by electroless deposition techniques. This usually results in a thin coating with a thickness in the order of 1 mil, and below and minimizes subsequent metal removal during the formation of circuit elements. The metal applied is conveniently nickel, copper, cobalt, gold or other metal selected both for ease of application and performance in the final circuit board. Usually, the metal is a transition metal with an atomic number of about 21–79 such as nickel, copper, gold, silver, cobalt, and the like. Preferably, the metal is nickel or copper.

When the metal coating is applied over the entire hydrocarbon surface, this layer is often partially masked and the remaining areas electroplated to provide a final metal layer for circuit purposes. The metal selected is also one within the above group of transition metals and preferably is copper, silver, or gold. The mask and underlying electroless metal is then removed by known techniques.

The resultant board commonly exhibits bond strengths in excess of 1 lb./in. as measured by the 90° peel test and often exhibits values of 3–4 lbs./in. and above. Accordingly, the performance of the resultant board is considered unusually satisfactory for its purposes.

The following examples illustrate some of the embodiments of this invention. It is to be understood that these are for illustrative purposes only and do not purport to be wholly definitive to conditions or scope.

EXAMPLE I

A hydrocarbon substrate was prepared by coating an etched, thermoset-hydrocarbon laminate with a toluene solution containing about 5 weight percent of a styrene-butadiene block copolymer based on approximately 23–25 weight percent styrene. The solution also contained approximately 6 pph of benzoyl peroxide to provide later cure.

The coated product was baked at about 100° C. for approximately 48 minutes to provide solvent removal and partial cure of the hydrocarbon coating. The board was then treated with an etchant composed of about 69 weight percent of 96 percent sulfuric acid, 25 weight percent of 85 percent phosphoric acid, 2 weight percent of sodium dichromate (dihydrate) and about 5.0 weight percent water. Treatment was carried ou at about 55° C. for about 1–2 minutes. After being rinsed, the board was treated with a solution of 10 weight percent of stannous chloride, rinsed with water, and immersed in a HCl solution of palladium chloride (about 1g./l.).

A thin nickel coating was applied to the rinsed sensitized surface using a nickel chloride solution with a hypophosphite reducing agent. The thickness was sufficient to render the surface conductive to an electrical current.

Subsequently, copper was electroplated to a thickness of approximately 1 mil. The resultant metal coating plate was then heated at approximately 100° C. for about 48 minutes to remove water and complete the curing cycle.

A 90° peel strength test was carried out on a sample of the metal coated, thermoset board using a peel rate of about 2 inches per minute on 1-inch (width) samples. Values of 5–6 lbs. per inch were obtainted.

EXAMPLE II

Additional samples of a metal coated board were prepared using the techniques of Example I. The coating solutions contained from 2 ½ to 10 weight percent of the butadienestyrene polymer in toluene with the curing agent being in a concentration of about 6 pph. Samples of the dip coated laminate after being coated with electroless metal were then plated with copper to varying thicknesses. The resultant samples were then subjected to dip-solder resistance tests at 500° F. in which the sample was immersed in solder and the degree of blistering and destruction of the metal bond to the hydrocarbon surface was determined. In the test, it was found that samples prepared from polymer concentrations of 2 ½ to 5 weight percent produced products which passed the dip-solder test for at least 60 seconds. In these test, the thickness of copper plate on the various samples that passed the 60 second, dip-solder test, ranged from 0.056 mils to 0.15 mils.

EXAMPLE III

A hydrocarbon laminate was fabricated from layers of phenolformaldehyde treated paper which had been saturated with a graft copolymer of polybutadiene and styrene. The copolymer was based on a butadiene content of approximately 60 mole percent, a 1,2 unsaturation in the polybutadiene of about 60–70 percent, and contained an organic peroxy catalyst. Fabrication of the laminate was carried out with curing of the polymeric hydrocarbon to provide a thermoset laminate.

The laminate was cleaned with an alkaline solution and then treated with an etchant solution containing about 24 weight percent of 96 percent sulfuric acid, 68 weight percent of 85 percent phosphoric acid, 4 weight percent of sodium dichromate (dihydrate) and 4 weight percent of water. Treatment was carried out at about 175° F. with vigorous agitation for about 15–20 minutes. The board was then rinsed, immersed in a 5 percent NaOH solution at about 110° F. for a few minutes, rinsed again, and then sensitized in the manner described in Example I.

After being sensitized, the board was rinsed and coated with a thin layer of nickel applied from the solution described in Example I. An electroplated coating of copper was then applied and the resultant board was baked at about 200° F. for about 48 minutes.

A 90° peel test was carried out on a sample of the board. Values of 3–4 lbs. per inch were obtained as measured at the rate of 2 in./min.

While the invention has been described in conjunction with specific examples thereof, these are illustrative only. Accordingly, many alternatives, modification and variations will be apparent to those skilled in the art in the light of the foregoing description, and it is therefore intended to embrace all such alternatives, modifications and variations as to fall within the spirit and broad scope of the appended claims.

We claim:

1. A printed circuit board comprising a substrate of a butadiene-styrene hydrocarbon copolymer containing at least 25 mol percent butadiene and having a vinyl, 1,2 unsaturation of from about 50 to about 90 percent of the total unsaturation and an electroless metal deposit bonded to at least a portion of the substrate said substrate being further characterized in that it is capable of achieving a high degree of bonding with the electroless metal deposit and requires only a strong acid etching pretreatment prior to sensitizing and subsequent deposition of said electroless metal and is free of non hydrocarbon material and wherein the substrate has apertures extending from one outer surface to the opposite outer surface and the interiors of the apertures are covered with the hydrocarbon copolymer.

2. The printed circuit board of claim 1 wherein hydrocarbon copolymer has a number average molecular weight of about 500 to about 5,000.

3. The printed circuit board of claim 1 wherein the hydrocarbon copolymer contains at least 35 mol percent butadiene.

4. The printed circuit board of claim 1 wherein the substrate is a butadiene-styrene block copolymer.

5. The printed circuit board of claim 1 wherein the substrate is a butadiene-styrene graft copolymer.

6. The printed circuit board of claim 1 wherein the substrate contains an interior reinforcing member.

7. The printed circuit board of claim 1 wherein the metal of the electroless metal deposit is selected from at least one transition metal having an atomic number of from 21 to 79.

8. The printed circuit board of claim 7 wherein the metal is nickel.

9. The printed circuit board of claim 7 wherein the metal is copper.

* * * * *